US006998152B2

(12) United States Patent
Uhlenbrock

(10) Patent No.: US 6,998,152 B2
(45) Date of Patent: Feb. 14, 2006

(54) CHEMICAL VAPOR DEPOSITION METHODS UTILIZING IONIC LIQUIDS

(75) Inventor: Stefan Uhlenbrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 855 days.

(21) Appl. No.: 09/468,292

(22) Filed: Dec. 20, 1999

(65) Prior Publication Data

US 2002/0001674 A1 Jan. 3, 2002

(51) Int. Cl.
*C23C 16/448* (2006.01)
(52) U.S. Cl. .............................. 427/248.1; 427/255.23; 427/255.28; 118/72.6
(58) Field of Classification Search ............ 427/248.1, 427/255.23, 255.25, 255.28; 118/715, 726, 118/724, 725
See application file for complete search history.

(56) References Cited

U.S. PATENT DOCUMENTS

| 4,430,149 | A |   | 2/1984  | Berkman |
| 4,839,249 | A | * | 6/1989  | Jones et al. ................. 429/194 |
| 5,188,914 | A | * | 2/1993  | Blomgren et al. .......... 429/112 |
| 5,232,869 | A | * | 8/1993  | Frigo et al. ................. 437/133 |
| 5,674,574 | A |   | 10/1997 | Atwell et al. |
| 5,693,377 | A |   | 12/1997 | Westmoreland et al. |
| 5,731,101 | A | * | 3/1998  | Sherif et al. ................ 429/102 |
| RE35,785  | E |   | 5/1998  | Sandhu et al. |
| 5,789,027 | A |   | 8/1998  | Watkins et al. |
| 5,827,602 | A | * | 10/1998 | Koch et al. ................. 429/194 |
| 5,835,678 | A |   | 11/1998 | Li et al. |
| 5,874,131 | A |   | 2/1999  | Vaartstra et al. |
| 5,902,651 | A |   | 5/1999  | Westmoreland et al. |
| 5,924,012 | A |   | 7/1999  | Vaartstra |
| 5,928,427 | A |   | 7/1999  | Hwang |
| 6,019,840 | A | * | 2/2000  | Hartmann et al. ............ 117/89 |
| 6,071,109 | A | * | 6/2000  | Biefeld et al. ......... 425/255.34 |

FOREIGN PATENT DOCUMENTS

| WO | WO 95/21806  |   | 8/1995 |
| WO | WO 95/21871  |   | 8/1995 |
| WO | WO 95/21872  |   | 8/1995 |
| WO | WO-95/21872  | * | 8/1995 |
| WO | WO 96/18459  |   | 6/1996 |

(Continued)

OTHER PUBLICATIONS

Freemantle, "Designer Solvents: Ionic liquids may boost clean technology development" C&EN, Mar. 30, 1998, pp. 32-37.*

(Continued)

*Primary Examiner*—Timothy Meeks
*Assistant Examiner*—Wesley Markham
(74) *Attorney, Agent, or Firm*—Klarquist Sparkman, LLP

(57) ABSTRACT

The present invention provides methods and apparatus for vaporizing and transporting precursor molecules to a process chamber for deposition of thin films on a substrate. The methods and apparatus include CVD solvents that comprise ionic liquids. The ionic liquids comprise salt compounds that have substantially no measurable vapor pressure (i.e., less than about 1 Torr at about room temperature), exhibit a wide liquid temperature range (i.e., greater than about 100° C.), and have low melting points (i.e., less than about 250° C.). A desired precursor is dissolved in a selected CVD solvent comprising an ionic liquid. The solvent and precursor solution is heated to or near the precursor volatilization temperature of the precursor. A stream of carrier gas is directed over or is bubbled through the solvent and precursor solution to distill and transport precursor molecules in the vapor phase to a deposition chamber. Conventional deposition processes may be used to deposit the desired thin film on a substrate.

25 Claims, 2 Drawing Sheets

FOREIGN PATENT DOCUMENTS

WO          WO 98/06106          2/1998

OTHER PUBLICATIONS

Nonaqueous Ionic Liquids as Reaction Solvents, Yves Chauvin and Helene Olivier-Bourbiogou, Enabling Science, Sep. 1995 (pp 26-30).

Designer Solvents: Ionic Liquids may Boost Clean Technology Development, Michael Freemantle, C&EN, Mar. 1998 (pp 32-37).

Structure of 1-Ethyl-3-methylimidazolium Hexafluorophoshpate: Model for Room Temperature Molten Salts, Joan Fuller, Richard T. Carlin, Hugh C. De Long and Dustin Haworth, J. Chem. Soc. Chem. Commun., 1994 (pp. 299-300).

Room Temperature Haloaluminate Ionic Liquids. Novel Solvents for Transition Metal Solution Chemistry, Charles L Hussey, Pure & Appl. Chem. vol. 60, No. 12, 1988 (pp. 1763-1772).

Quaternary Ammonium Nitrates. Part I. Preparation from Alkyl Nitrates and from aw-Polymethylene Dinitrates, E.S. Lane, J. Chem. Soc., 1953 (pp 1172-1175).

An Electrochemical and Spectroscopic Study of Some Aromatic Hydrocarbons in the Room Temperature Molten Salt System Aluminum Chloride-n-Butylpyridinium Chloride, J. Robinson and R. A. Osteryoung, J. American Chemical Society, 101:2, Jan. 17, 1979 (pp 323-327).

Aluminum Bromide-1-Methyl-3-Ethylimidazolium Bromide Ionic Liquids, John R. Sanders, Edmund H. Ward and Charles L. Hussey, J. Electrochem. Soc., Feb. 1986, vol. 133, No. 2 (pp. 325-330).

Room Temperature Molten Salts, Joan Fuller, Richard T. Carlin, Hugh C. De Long and Dustin Haworth, J. Chem. Soc. Chem. Commun., 1994 (pp. 299-300).

Dialkylimidazolium Chloroaluminate Melts: A New Class of Room-Temperature Ionic Liquids for Electrochemistry, Spectroscopy, and Synthesis, John S. Wilkes, Joseph A. Levisky, Robert A. Wilson and Charles L. Hussey, Inorg. Chem. 1982, 21 (pp. 1263-1264).

Air and Water Stable 1-Ethyl-3-methylimidazolium Based Ionic Liquids, John S. Wilkes and Michael J. Zaworotko, J. Chem. Soc., Chem. Commun., 1992 (pp. 965-967).

\* cited by examiner

CHEMICAL VAPOR DEPOSITION METHODS UTILIZING IONIC LIQUIDS

TECHNICAL FIELD

The present invention concerns methods for vapor deposition, and particularly concerns methods for providing volatile precursor molecules to form a thin film on a substrate via vapor deposition.

BACKGROUND OF THE INVENTION

Chemical vapor deposition (CVD) is one process for forming thin films on semiconductor wafers, such as films of elemental metals or compounds. CVD involves the formation of a non-volatile solid film on a substrate by the reaction of vapor phase reactants (precursors) that contain desired components of the film. Standard CVD processes use a precursor source in a vaporization chamber of a CVD apparatus. The vaporization chamber is connected to a process (or reactor) chamber wherein a deposition substrate, such as a semiconductor wafer, is located.

CVD (and other thin film vapor deposition) techniques require delivery of a controlled mass of the precursor in the vapor phase. Precise control over the mass of the precursor delivered to the process chamber is needed to form a uniform layer of the desired thin film. In addition, the manner of delivery of the precursor must avoid decomposition of the reactive volatile precursor molecules and must not include unwanted volatized elements or compounds.

Conventional methods of providing a source of vapor-phase precursor molecules include (1) direct vaporization of the precursor from neat solids or liquids, (2) direct vaporization of a solvent containing the precursor, and (3) distilling precursor molecules from a solvent by bubbling a carrier gas through a volume of the solvent containing the precursor.

Bulk sublimation of a solid precursor and transport of the vaporized solid precursor to the process chamber using a carrier gas has been practiced. However, it is difficult to vaporize a solid at a controlled rate such that a constant and reproducible flow of vaporized solid precursor is delivered to the process chamber. Lack of control of the rate of delivery of a vaporized solid precursor is (at least in part) due to a changing surface area of the bulk solid precursor as it is vaporized. The changing surface area of the solid precursor when it is exposed to sublimation temperatures produces a continuously changing rate of vaporization. This is particularly true for thermally sensitive compounds. The changing rate of vaporization thus results in a continuously changing concentration and non-reproducible flow of vaporized precursor delivered for deposition in the process chamber. As a result, film growth rate and the composition of films deposited using such techniques are not adequately controlled. Further, sublimation of solid precursors requires exposure of the precursor to temperatures greater than the vaporization temperature. Many precursor materials decompose when quickly heated to such temperatures.

Liquid precursors may be vaporized directly using a bubbler device. A liquid precursor is heated in a reservoir to a temperature at which there is sufficient vaporization to maintain a particular deposition rate. A stream of carrier gas is directed over the precursor or is bubbled through the liquid precursor in the reservoir. The carrier gas transports vaporized precursor molecules to a process chamber for deposition of a CVD thin film. However, many desirable precursor molecules, when heated to a temperature sufficient to maintain a particular deposition rate will simply decompose in the bubbler.

It is also possible to dissolve a liquid or solid precursor in a solvent and vaporize the solution directly. (Many desirable precursors are solids at room temperature). In the vaporizer (the inlet to which often contains a needle or small orifice), the solvent and the precursor are quickly heated to the gas phase. One of the problems associated with this technique is that the high temperatures necessary to quickly vaporize the solution cause solvent and precursor molecules to decompose. Decomposition of the solvent and precursor molecules within the vaporizer typically produces particulates that clog or otherwise obstruct the delivery lines between the precursor reservoir and the process chamber. Obstruction of the delivery lines cause inconsistent delivery rates of precursor for deposition on the substrate. In addition, the conventional CVD solvents used to dissolve such precursors typically result in CVD processes where the solvent molecules are carried along with the precursor. Additionally, such solvent molecules have a tendency to decompose, further obstructing the delivery lines or may be deposited on the substrate. Solvent decomposition products, e.g., carbonates, formed in the thin film result in poor thin film quality.

As an alternative, liquid or solid precursors may be mixed with or dissolved in a conventional CVD solvent and the solvent containing the precursor placed in a bubbler device. The solvent containing the dissolved precursor is then heated in a reservoir. As described above for liquid precursors, a stream of carrier gas is directed over or bubbled through the solvent. The carrier gas transports the volatile precursor molecules from the solvent to a process chamber. The advantage of this technique is that most precursor elements or compounds may be vaporized in a bubbler device at lower temperatures than required for sublimation or direct vaporization of the precursor. Additionally, control of mass delivery of the precursor, using a bubbler device, is typically better than other precursor vaporization methods. Unfortunately, available CVD solvents are typically organic compounds possessing vapor pressures of greater than about 1 Torr at about room temperature. Accordingly, volatilized solvent molecules are often transported to the process chamber along with the precursor molecules. This problem is exacerbated when temperatures above room temperature are needed to volatilize sufficient precursor molecules and/or to maintain a given depositon rate. As a result, solvent molecules or solvent decomposition products are deposited in the thin-film.

Further, known CVD solvents do not dissolve the range of solid precursors necessary to form the CVD thin films currently in demand. Moreover, many of the known CVD solvents for precursor materials are corrosive to the CVD apparatus, the substrate, and/or thin films already formed on the substrate.

Accordingly, methods and apparatus that take advantage of the benefits of using a bubbler (i.e., lower temperatures and increased control of precursor delivery rates), but overcome the limitations imposed by conventional CVD solvents are needed. CVD methods and apparatus that do not lead to transport of solvent molecules along with the vaporized precursors are needed. That is, CVD methods and apparatus are needed that include solvents having extremely low or substantially no measurable vapor pressure. Additionally, CVD methods and apparatus that may be used along with a conventional bubbler device technology would be preferred. In order to increase the range of precursors that may be used to deposit CVD thin films, CVD methods and apparatus including solvents that exhibit a wide liquid-temperature range and that are resistant to decomposition at relatively high-temperature levels, are needed. Further, CVD methods and apparatus that include solvents that are relatively inert and that dissolve a variety of precursor materials having a wide range of polarities, are needed.

SUMMARY OF THE INVENTION

In light of the deficiencies of the prior art, the present invention provides methods and apparatus for vaporizing and transporting precursor molecules to a process chamber for deposition of thin films on a substrate. The methods and apparatus may be used with conventional CVD bubbler apparatus. The methods and apparatus include CVD solvents that comprise ionic liquids (i.e., liquids comprising ions) that have low melting points (i.e., less than about 250° C.), wide liquid temperature ranges (i.e., liquid temperature ranges preferably of at least about 100° C. and more preferably of at least about 200° C.), and substantially no measurable vapor pressure (i.e., the ionic liquid solvents are non-volatile). The ionic liquid CVD solvents have a vapor pressure of preferably less than about 1 Torr at about room temperature and more preferably less than about 0.1 Torr at room temperature.

For example, the vapor deposition methods and apparatus of the present invention include CVD solvents comprising ionic liquids that satisfy Formula (1) as follows:

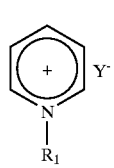

(1)

wherein $R_1$ is an alkyl and $Y^-$ is selected from the group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. Preferably, $R_1$ is an alkyl having a carbon chain of from about 1 carbon atom to about 30 carbon atoms. Alternatively, $R_1$ may be selected from a group consisting essentially of methyl groups, ethyl groups, propyl groups, isopropyl groups, n-butyl groups, sec-butyl groups, tert-butyl groups, isobutyl groups, pentyl groups, and mixtures thereof.

The vapor deposition methods and apparatus of the present invention may also include CVD solvents comprising ionic liquids that satisfy Formula (2) as follows:

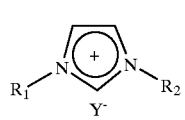

(2)

wherein $R_1$ and $R_2$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from the group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$ or $R_2$ comprise an alkyl, the alkyl preferably includes a carbon chain comprising from about 1 carbon atom to about 30 carbon atoms.

The vapor deposition methods and apparatus of the present invention may also include CVD solvents comprising ionic liquids that satisfy Formula (3) as follows:

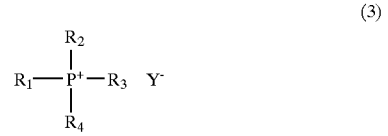

(3)

wherein $R_1$, $R_2$, $R_3$, and $R_4$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, $R_3$, or $R_4$ comprises an alkyl, preferably, the alkyl comprises a carbon chain having from about 1 carbon atom to about 30 carbon atoms.

The vapor deposition methods and apparatus of the present invention also include CVD solvents comprising ionic liquids that satisfy Formula (4) as follows:

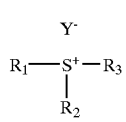

(4)

wherein $R_1$, $R_2$, and $R_3$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, or $R_3$ comprises an alkyl, preferably, the alkyl comprises a carbon chain having from about 1 carbon atom to about 30 carbon atoms.

The vapor deposition methods and apparatus of the present invention may also include CVD solvents comprising ionic liquids that satisfy Formula (5) as follows:

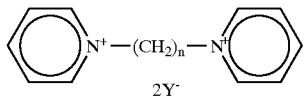

(5)

wherein n is from about 1 to about 10, and Y⁻ is selected from a group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof.

The vapor deposition methods of the present invention may include dissolving precursors in solvents comprising ionic fluids that satisfy Formula (6) as follows:

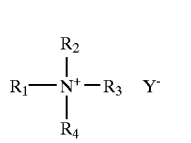

(6)

wherein $R_1$, $R_2$, $R_3$, and $R_4$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and Y⁻ is selected from a group consisting essentially of halides, sulfates, nitrates, acetates, nitrites, chlorocuprates, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, $R_3$, or $R_4$ comprises an alkyl, preferably, the alkyl comprises a carbon chain having from about 1 carbon atom to about 30 carbon atoms.

The present invention further includes heating the solvent containing the dissolved precursor to a temperature at or near the volatilization temperature of the dissolved precursor. A stream of gas is then directed over or bubbled through the solvent. The gas transports precursor molecules from the solvent to a process or deposition chamber (without transporting solvent molecules) to form a thin film on a substrate, such as a semiconductor wafer.

The vapor deposition methods of the present invention provide for the vaporization and transport of a controlled mass of precursor molecules in the vapor phase. Due to the unique CVD solvents used in practicing the vapor deposition methods of the present invention, solvent molecules are not transported to the process chamber along with the vaporized precursors. Further, because the vapor deposition methods of the present invention include solvents that have an extremely low or substantially no measurable vapor pressure, the range of precursor materials that may be vaporized in the solvent without unwanted decomposition of the solvent or vaporization of the solvent itself is increased. Additionally, the vapor deposition methods of the present invention include use of solvents that may be used with conventional bubbler device technology and that are non-corrosive Moreover, because the present invention vapor deposition methods use of solvents that exhibit a wide liquid temperature range (i.e., greater than about 100° C.), there is a significant increase in the range of materials that may be deposited.

DETAILED DESCRIPTION

Figure 1:
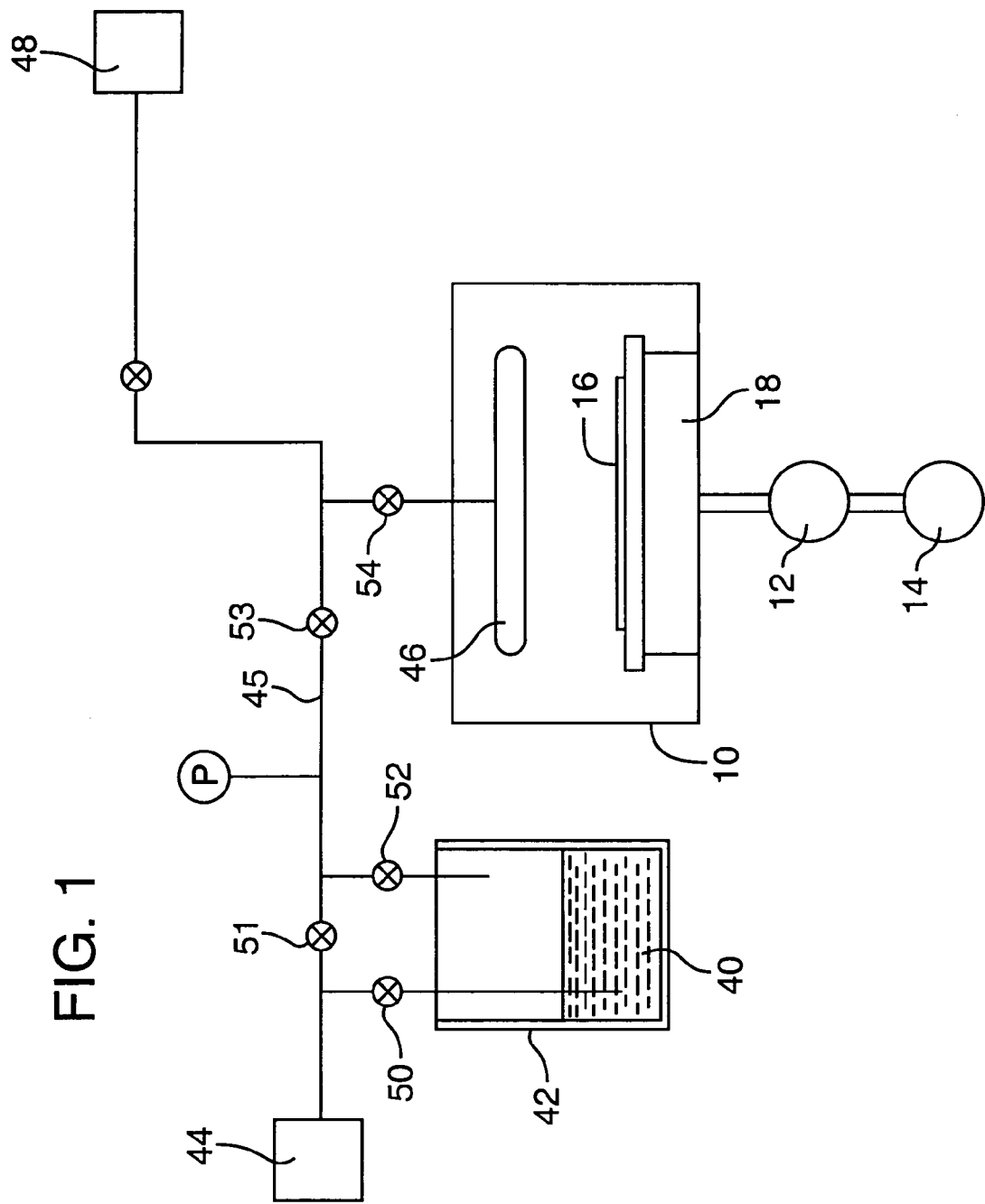
FIG. 1 is a schematic of a conventional chemical vapor deposition system.

The vapor deposition methods and apparatus of the present invention include chemical vapor deposition (CVD) solvents that comprise ionic liquids. Such solvents, in contrast to conventional CVD solvents, possess wide liquid temperature ranges (typically greater than about 100° C.) and exhibit substantially no measurable vapor pressure (i.e., less than about 1 Torr at about room temperature). Further, the present methods and apparatus include ionic liquid CVD solvents that dissolve a wide variety of precursor materials.

The methods and apparatus of the present invention further include ionic liquid CVD solvents that are relatively inert and stable. For example, chloroaluminate ionic liquids are air and water sensitive (i.e., such ionic liquids tend to be unstable in the presence of air or water), but hexafluorophoshate, and tetrafluoroborate ionic liquids are not.

The methods and apparatus of the present invention include ionic liquids that are liquids at ambient temperature so that dissolution of the precursor molecules may be accomplished without heating the mixture. As mentioned below, the cation of the ionic liquid CVD solvent may be selected for its effect on the melting point of the ionic liquid as well as its solvating properties.

Physical characteristics of the ionic liquid CVD solvents of the methods and apparatus of the present invention may be altered in order to allow dissolution and vaporization of a wide variety of precursors. As known to those of ordinary skill in the art, adjustment may be made to the physical properties of a compound to change one or more particular characteristics of the compound. For example, substituting the cation of an ionic liquid and/or substituting the anion will alter the ionic liquid's physical properties. As disclosed in Michael Freemantle, "Designer Solvents," *Chemical and Engineering News*, pp. 32–37 (March 1998), the cation portion of an ionic liquid compound is largely responsible for the low melting point of the ionic liquids. The anion portion of the ionic liquid compound determines (to a large extent) its chemical properties, such as reactivity and catalytic activity. Some ionic liquid anions, for example chloroaluminate, exhibit Lewis acidity. Ionic liquids comprising such ions may react undesirably with certain precursor molecules. Other ionic liquid anions such as nitrate are more generally inert and are useful for a wider range of precursors. The respective miscibilities of organic compounds, such as precursor molecules, in ionic liquids can be varied extensively by altering the chain lengths of alkyl substituents on the ionic liquid compound cations. Thus it is possible to tailor the solvent properties of ionic liquids through the appropriate choice of alkyl substituents. For example, a more non-polar precursor is more soluble in an ionic liquid having more non-polar character (i.e., ionic liquids possessing larger R groups). Conversely, for example, a polar precursor molecule will be most soluble in ionic liquids that possess small alkyl substituents and are more polar. Thus, the methods and apparatus of the present invention include ionic liquid CVD solvents that are able to dissolve relatively large quantities of a wide variety of precursors.

Although the vapor deposition methods and apparatus of the present invention are primarily discussed with reference to chemical vapor deposition, it should be understood that the vapor deposition methods and apparatus may be applicable to any thin film deposition technique requiring a source of volatile molecules or precursors. Such techniques may include for example, physical vapor deposition, chemical vapor deposition, metal organic chemical vapor deposition, atmospheric pressure vapor deposition, low pressure chemical vapor deposition, plasma enhanced low pressure vapor deposition, molecular beam epitaxy, and atomic layer epitaxy.

Likewise, although the vapor deposition methods of the present invention are discussed primarily with reference to semiconductor substrates or semiconductor wafers, it should be understood that the substrate may comprise silicon, gallium arsenide, glass, an insulating material such as sapphire, or any other substrate material upon which thin films may be deposited.

A typical chemical vapor deposition system that can be used to perform the deposition methods of the present invention is shown in FIG. 1. The CVD system includes an enclosed process (deposition) chamber 10. As is conventional CVD, the CVD process may be carried out at pressures of from about atmospheric pressure down to about $10^{-3}$ Torr, and preferably from about 1.0 to about 0.1 Torr. Accordingly, a vacuum may be created in chamber 10 using a pump 12 (e.g., a turbo pump) and backing pump 14.

One or more substrates 16 are positioned in the process chamber 10. A constant nominal temperature is established for the substrate 16, preferably at a temperature of about 0° C. to about 800° C., and more preferably at a temperature of about 100° C. to about 500° C. Substrate 16 may be heated, for example, by an electrical resistance heater 18 on which substrate 16 is mounted Other known methods of heating the substrate 16 may be utilized.

A precursor is dissolved in an ionic liquid solvent 40 (as discussed in detail below). The ionic liquid solvent 40 (having a desired precursor dissolved therein) is stored in a vessel 42. The ionic liquid solvent 40 including the dissolved precursor is heated to or near the vaporization point of the dissolved precursor. The bubbler system as shown in FIG. 1 transports vaporized precursor molecules from the ionic liquid solvent to the CVD process chamber 10. Specifically, a carrier gas 44 is pumped into vessel 42 and bubbled through the ionic liquid solvent 40. The carrier gas 44 may comprise any suitable inert gas. The carrier gas 44 typically is selected from a group consisting essentially of nitrogen, helium, argon, and mixtures thereof.

The carrier gas 44 distills the dissolved precursor molecules from the ionic liquid solvent 40 and transports the precursor molecules to the process chamber 10 through line 45 and gas distributor 46. Additional inert carrier gas may be supplied from source 48 as needed to provide the desired concentration of precursor and to regulate the uniformity of the deposition across the surface of substrate 16. As shown, a series of valves 50–54 are opened and closed as required to deliver vaporized precursor and carrier gas to the process chamber 10.

Generally, the precursor is pumped into the process chamber 10 at a flow rate of about 1 sccm (standard cubic centimeters per minute) to about 1000 sccm. The substrate 16 is exposed to the precursor at a pressure of about 0.001 Torr to about 100 Torr for a time period of about 0.01 minutes to about 100 minutes depending upon the desired thickness of the layer being deposited. In the process chamber 10, the precursor forms a layer on the surface of the substrate 16. The deposition rate is temperature dependent and thus, increasing the temperature of the substrate 16 increases the rate of deposition. Typical deposition rates are about 100 Å per minute to about 10,000 Å per minute. Closing valve 53 discontinues delivery of the carrier gas containing the precursor to the process chamber 10.

Figure 2:
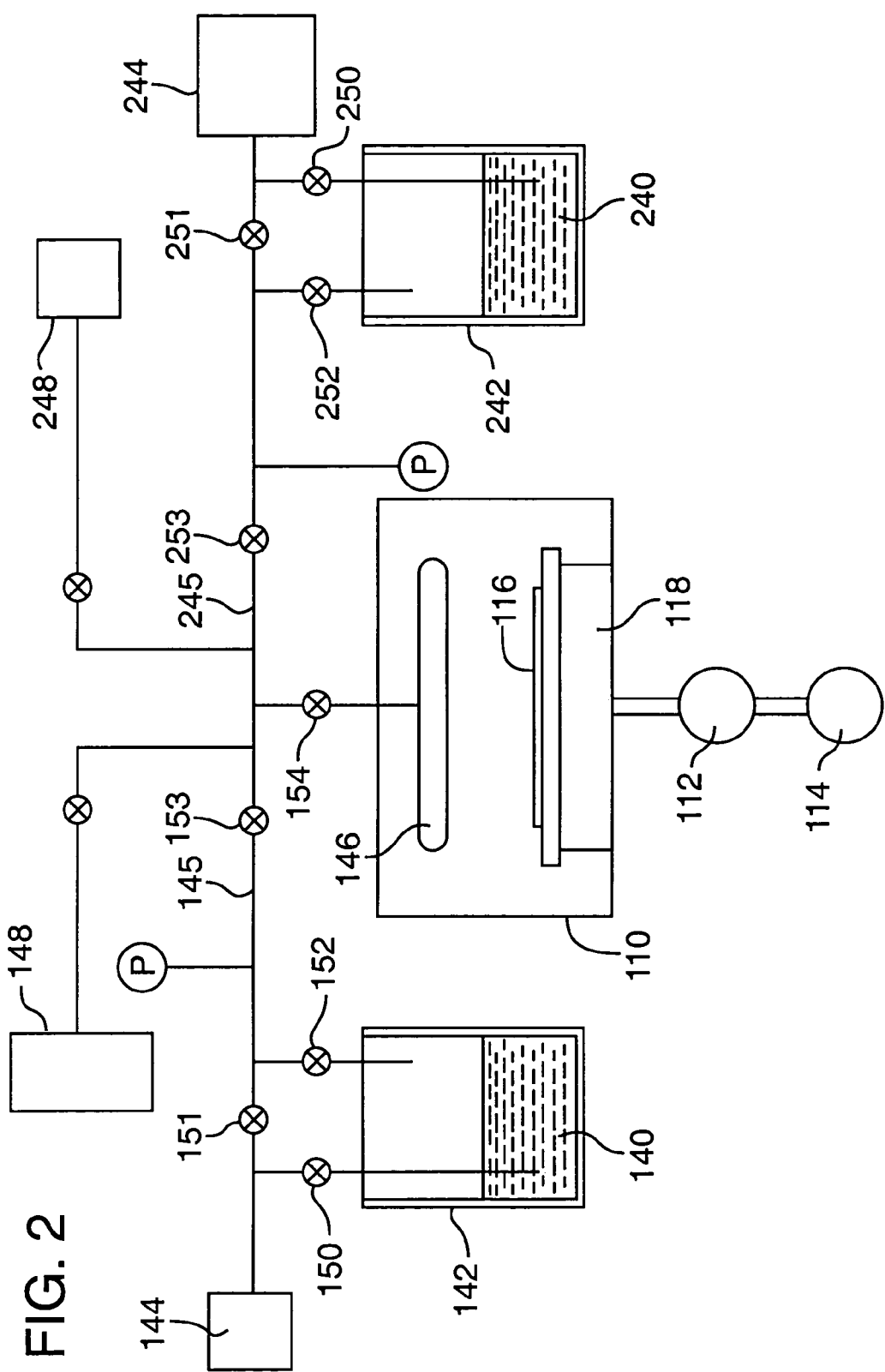
FIG. 2 is a schematic of another chemical vapor deposition system.

Alternatively, if more than one precursor is to be dissolved in a solvent and transported to a process chamber, the vapor deposition system shown in FIG. 2 may be used. As shown in FIG. 2, the CVD system may include an enclosed chemical vapor deposition chamber 110. The CVD process may be carried out at pressures of from atmospheric pressure down to about $10^{-3}$ Torr, and preferably from about 10 Torr to about 0.1 Torr. A vacuum may be created in chamber 110 using turbo pump 112 and backing pump 114, or simply a backing pump.

One or more substrates 116 are positioned in process chamber 110. A constant nominal temperature is established for the substrate, preferably at a temperature of about 50° C. to about 500° C. for certain precursors. Substrate 116 may be heated, for example, by an electrical resistance heater 118 on which substrate 116 is mounted. Other known methods of heating the substrate may also be utilized.

In this process, a first precursor is dissolved in a solvent of the present invention to form a first solution 140 and is stored in vessel 142. A source of a suitable inert gas 144 is pumped into vessel 142 and bubbled through the first solution 140 picking up the first precursor and transporting it into chamber 110 through line 145 and gas distributor 146. Additional inert carrier gas or reaction gas may be supplied from source 148 as needed to provide the desired concentration of precursor and regulate the uniformity of the deposition across the surface of substrate 116. As shown, a series of valves 150–154 may be opened and closed as required.

A second precursor may be dissolved in a solvent to form a second solution 240. Second solution 240 is stored in vessel 242. A source 244 of a suitable inert gas is pumped into vessel 242 and bubbled through the second solution 240 picking up the second precursor and carrying it into chamber 110 through line 245 and gas distributor 146. Additional inert carrier gas or reaction gas may be supplied from source 248 as needed to provide the desired concentration of precursor composition and regulate the uniformity of the deposition across the surface of substrate 116. As shown, a series of valves 250–253 and 154 are opened and closed as required.

Generally, the first and second vaporized precursor molecules are pumped into the process chamber 110 at a flow rate of about 1 sccm to about 1000 sccm. The respective flow rates of the first and second precursors may be varied to provide the desired ratio of first precursor to second precursor in the co-deposited thin film. The substrate 116 is typically exposed to the precursor compositions at a pressure of about 0.001 Torr to about 100 Torr for a time of about 0.01 minutes to about 100 minutes. In process chamber 110, the first and second precursors will form an absorbed layer on the surface of the substrate 116. As the co-deposition rate is temperature dependent, increasing the temperature of the substrate will increase the rate of co-deposition. Typical co-deposition rates are about 10 Å/min. to about 1000 Å/min. Closing valves 153 and 253 terminates the carrier gases transporting the first and second precursors, respectively.

Various combinations of carrier gases and/or vaporized precursors may be used to practice the vapor deposition methods of the present invention. The carrier gas and precursors may be introduced into a process chamber in a variety of manners, as known to those persons skilled in the art.

The vapor deposition methods and apparatus of the present invention include CVD solvents that comprise ionic liquids. As used herein, an ionic liquid means a salt compound having the following characteristics: (1) a melting point of less than about 250° C., (2) substantially no measurable vapor pressure (i.e., less than about 1 Torr and preferably less than 0.1 Torr), (3) a liquid range of about at least 100° C., and, preferably about at least 200° C., and (4) functions as a solvent for a wide range of desirable CVD precursor elements and compounds.

For example, the methods and apparatus of the present invention include CVD solvents comprising ionic liquids that satisfy Formula (1) as follows:

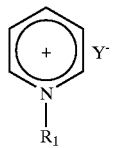

(1)

wherein $R_1$ is an alkyl and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. Preferably, $R_1$ is an alkyl having a carbon chain of from about 1 carbon atom to about 30 carbon atoms. Alternatively, $R_1$ is selected from a group consisting essentially of a methyl group, ethyl group, propyl group, isopropyl group, n-butyl group, sec-butyl group, tert-butyl group, isobutyl group, pentyl group, and mixtures thereof.

The methods and apparatus of the present invention also include CVD solvents comprising ionic liquids that satisfy Formula (2) as follows:

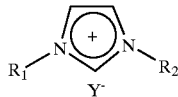

(2)

wherein $R_1$ and $R_2$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$ or $R_2$ comprise an alkyl, the alkyl preferably includes a carbon chain comprising from about 1 carbon atom to about 30 carbon atoms.

The methods and apparatus of the present invention also include CVD solvents comprising ionic liquids that satisfy Formula (3) as follows:

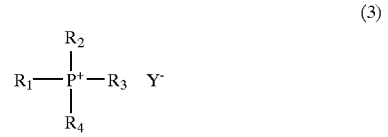

(3)

wherein $R_1$, $R_2$, $R_3$, $R_4$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, $R_3$, or $R_4$ is an alkyl, preferably, the alkyl comprises a carbon chain of from about 1 carbon atom to about 30 carbon atoms.

The methods and apparatus of the present invention also include CVD solvents comprising ionic liquids that satisfy formula (4) as follows:

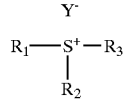

(4)

wherein $R_1$, $R_2$, and $R_3$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, or $R_3$ comprises an alkyl, preferably, the alkyl comprises a carbon chain of from about 1 carbon atom to about 30 carbon atoms.

The methods and apparatus of the present invention also include CVD solvents comprising ionic liquids that satisfy Formula (5) as follows:

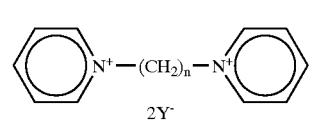

(5)

wherein n is from about 1 to about 10, and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof.

The methods and apparatus of the present invention also include CVD solvents comprising ionic liquids that satisfy Formula (6) as follows:

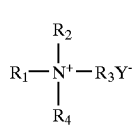

(6)

wherein $R_1$, $R_2$, $R_3$, $R_4$ are independently selected from a group consisting essentially of alkyls, methyl groups, ethyl groups, propyl groups, isopropyl groups, n-butyl groups, sec-butyl groups, tert-butyl groups, isobutyl groups, pentyl groups, and mixtures thereof, and $Y^-$ is selected from a group consisting essentially of halides, sulfates, nitrates, acetates, nitrites, tetrafluoroborates, tetrachloroborates, hexafluorophosphates, $[SbF_6]^-$, tetrachloroaluminates, heteropolyanions (e.g., $[Mo_{12}O_{40}]^{3-}$), trifluoromethanesulfonates, and mixtures thereof. When $R_1$, $R_2$, $R_3$, or $R_4$ is an alkyl, preferably, the alkyl comprises a carbon chain of from about 1 carbon atom to about 30 carbon atoms.

According to the vapor deposition methods of the present invention, a desired precursor is dissolved in a volume of a CVD solvent comprising an ionic liquid. The resulting precursor/solvent solution is placed within a CVD system vessel such as shown in FIG. 1 or 2. As readily determinable by those persons skilled in the art, the particular precursor are chosen based on the thin-film layer to be deposited. The ionic liquid is chosen based upon its ability to dissolve the desired precursor(s) (an ionic liquid capable of dissolving a relatively large quantity of precursor(s) is generally preferred). The vessel containing the precursor/solvent solution is preferably heated to a temperature at or near the volatilization temperature of the dissolved precursor(s). A stream of carrier gas is directed over or is bubbled through the solution to distill and transport vapor-phase precursor molecules to a process chamber for deposition of a thin film on a substrate.

The following example is offered to further illustrate a specific vapor deposition method of the present invention. It should be understood, however, that many variations and modifications could be made while remaining within the scope and spirit of the present invention.

EXAMPLE

This is an example of a chemical vapor deposition method of the present invention for the formation of a $(Ba,Sr)TiO_3$ thin-layer on a substrate, using an ionic liquid CVD solvent. Three precursors, Bis(isopropoxide)bis(2,2,6,6-tetramethyl-3,5-heptanedionato)titanium, Bis(2,2,6,6-tetramethyl-3,5-heptanedionato)strontium and Bis(2,2,6,6-tetramethyl-3,5-heptanedionato)barium (all available from, e.g., Strem Chemicals, Inc., of Newburyport, Mass.) are individually dissolved in separate vessels, each vessel containing a quantity of an ionic liquid comprising 1-Ethyl-3-methyl-1H-imidazolium tetrafluoroborate (available from, e.g., Aldrich Chemical Co., Inc., of Milwaukee, Wis.). As much of each precursor as possible is dissolved in the solvent. The solvent solutions having the precursors dissolved therein, are then placed in separate bubbler vessels (e.g., 142 and 242 of FIG. 2; although not shown in FIG. 2, a third analogous vessel and associated delivery means would be required in this particular example).

The vessel containing the titanium precursor is heated by conventional means to about 100° C. The vessels containing the strontium and the barium precursors are heated by conventional means to about 140° C. and 150° C., respectively. A source of carrier gas, e.g., helium, is supplied to each of the three vessels. At a pressure of about 2 Torr, the precursors are carried (in the vapor phase) to a process chamber (e.g., process chamber 110, FIG. 2). The Ba:Sr:Ti ratio of the precursors delivered to the process chamber is adjusted by changing the vessels' respective carrier gas flow rates, and/or the temperatures of the individual vessels.

Oxygen gas, as an additional reactant, is delivered to the process chamber by a separate means (e.g., from source 248 of FIG. 2). The four gases are then combined in a common line (e.g., 145 in FIG. 2) and are released into the process chamber by a gas distributor (e.g., 146 in FIG. 2). The Bis(isopropoxide)bis(2,2,6,6-tetramethyl-3,5-heptanedionato)titanium, Bis(2,2,6,6-tetramethyl-3,5-heptanedionato) strontium, Bis(2,2,6,6-tetramethyl-3,5-heptanedionato) barium, and oxygen react to form a $(Ba,Sr)TiO_3$ thin-film on a heated substrate (e.g., 116 in FIG. 2) within the process chamber. The thickness of the deposited film is dependent upon the deposition time and the substrate temperature, with longer deposition times and higher substrate temperatures leading to increased deposition rates.

Whereas the invention has been described with reference to a representative method, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method for vaporizing reactants for vapor deposition of a thin film on a substrate, comprising:
   providing an ionic liquid;
   dissolving a precursor in the ionic liquid; and
   passing a stream of gas through the ionic liquid,
   wherein the ionic liquid satisfies the formula:

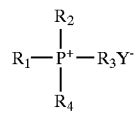

wherein $R_1$, $R_2$, $R_3$, $R_4$ are alkyls and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

2. The method of claim 1, wherein $R_1$ is an alkyl having a carbon chain comprising from about 1 carbon atom to about 30 carbon atoms.

3. The method of claim 1, wherein $R_1$, $R_2$, $R_3$, and $R_4$ are independently selected from a group consisting of methyl groups, ethyl groups, propyl groups isopropyl groups, n-butyl groups, sec-butyl groups, tert-butyl groups, isobutyl groups, pentyl groups, and mixtures thereof.

4. The method of claim 1, wherein $R_1$, $R_2$, $R_3$, and $R_4$ independently comprise methyl groups, ethyl groups, propyl groups, isopropyl groups, n-butyl groups, sec-butyl groups, tert-butyl groups, isobutyl groups, pentyl groups, or mixtures thereof.

5. A method for vaporizing reactants for vapor deposition of a thin film on a substrate, comprising:
   providing an ionic liquid;

dissolving a precursor in the ionic liquid; and
passing a stream of gas through the ionic liquid,
wherein the ionic liquid satisfies the formula:

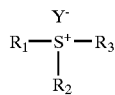

wherein $R_1$, $R_2$, and $R_3$ are alkyls and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

6. The method of claim 5, wherein $R_1$, $R_2$, and $R_3$ are independently selected from a group consisting of alkyls having carbon chains comprising from about 1 carbon atom to about 30 carbon atoms.

7. The method of claim 6, wherein $R_1$, $R_2$, and $R_3$ are independently selected from a group consisting of methyl groups, ethyl groups, propyl groups, isopropyl groups, n-butyl groups, sec-butyl groups, tert-butyl groups, isobutyl groups, and pentyl groups.

8. The method of claim 5, wherein $R_1$, $R_2$, and $R_3$ independently comprise alkyls having carbon chains comprising from about 1 carbon atom to about 30 carbon atoms.

9. A method for vaporizing reactants for vapor deposition of a thin film on a substrate, comprising:
providing an ionic liquid;
dissolving a precursor in the ionic liquid; and
passing a stream of gas through the ionic liquid,
wherein the ionic liquid satisfies the formula:

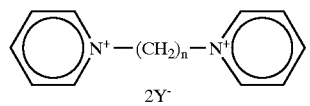

wherein n is from about 1 to about 10 and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

10. A method for vaporizing reactants for vapor deposition of a thin film on a substrate, comprising:
providing an ionic liquid;
dissolving a precursor in the ionic liquid; and
passing a stream of gas through the ionic liquid,
wherein the ionic liquid satisfies the formula:

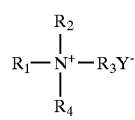

wherein $R_1$, $R_2$, $R_3$, $R_4$ are alkyls and $Y^-$ is selected from a group consisting of halides, sulfates, nitrates, acetates, nitrites, tetrafluoroborates, tetrachloroborates, hexafluorophosphates $[SbF_6]^-$, chloroaluminates, bromoaluminates, chlorocuprates, heteropolyanions, trifluoromethanesulfonates, and mixtures thereof.

11. The method of claim 10, wherein $R_1$ is an alkyl having a carbon chain comprising from about 1 carbon atom to about 30 carbon atoms.

12. The method of claim 10, wherein $R_1$, $R_2$, $R_3$, and $R_4$ are independently selected from a group consisting of methyl groups, ethyl groups, propyl groups, isopropyl groups, n-butyl groups, sec-butyl groups, tert-butyl groups, isobutyl groups, pentyl groups, and mixtures thereof.

13. The method of claim 10, wherein $R_1$, $R_2$, $R_3$, and $R_4$ independently comprise methyl groups, ethyl groups, propyl groups, isopropyl groups, n-butyl groups, sec-butyl groups, tert-butyl groups, isobutyl groups, pentyl groups, or mixtures thereof.

14. A method for vaporizing reactants for vapor deposition of a thin film on a substrate, comprising:
dissolving a precursor in a solvent that satisfies the formula:

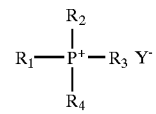

wherein $R_1$, $R_2$, $R_3$, $R_4$ are alkyl and $Y^-$ is selected from the group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof; and
bubbling a stream of gas through the solution containing the precursor to distill precursor molecules in the vapor phase from the solution.

15. A method for vaporizing reactants for vapor deposition of a thin film on a substrate, comprising:
dissolving a precursor in a solvent satisfying the formula:

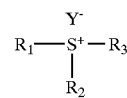

wherein $R_1$, $R_2$, and $R_3$ are alkyl and $Y^-$ is selected from the group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof; and
bubbling a stream of gas through the solution containing the precursor to distill precursor molecules in the vapor phase from the solution.

16. A method for vaporizing reactants for vapor deposition of a thin film on a substrate, comprising:
dissolving a precursor in a solvent that satisfies the formula:

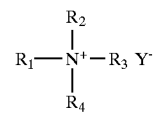

wherein $R_1$, $R_2$, $R_3$, $R_4$ are alkyl and $Y^-$ is selected from the group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof; and bubbling a stream of gas through the solution containing the precursor to distill precursor molecules in the vapor phase from the solution.

17. A method for vaporizing reactants for vapor deposition of a thin film on a substrate, comprising:

dissolving a precursor in a solvent that satisfies the formula:

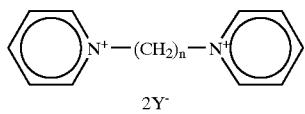

wherein n is from 1 to 10 and $Y^-$ is selected from the group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof; and bubbling a stream of gas through the solution containing the precursor to distill precursor molecules in the vapor phase from the solution.

18. A method for vaporizing reactants for position of a thin film on a substrate, comprising:

providing an ionic liquid that includes at least one precursor;

transporting the precursor in the vapor phase from the ionic liquid to a substrate;

heating the substrate to a temperature of about 0° C. to about 800° C.; and depositing the precursor on the substrate, wherein the ionic liquid satisfies the formula:

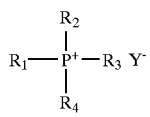

wherein $R_1$, $R_2$, $R_3$, $R_4$ are alkyls and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

19. A method for vaporizing reactants for deposition of a thin film on a substrate, comprising:

providing an ionic liquid that includes at least one precursor;

transporting the precursor in the vapor phase from the ionic liquid to a substrate;

heating the substrate to a temperature of about 0° C. to about 800° C.; and depositing the precursor on the substrate, wherein the ionic liquid satisfies the formula:

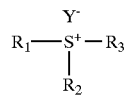

wherein $R_1$, $R_2$, and $R_3$ are alkyls and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

20. A method for vaporizing reactants for deposition of a thin film on a substrate, comprising:

providing an ionic liquid that includes at least one precursor;

transporting the precursor in the vapor phase from the ionic liquid to a substrate;

heating the substrate to a temperature of about 0° C. to about 800° C.; and depositing the precursor on the substrate, wherein the ionic liquid satisfies the formula:

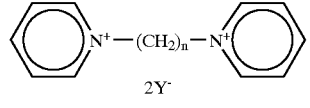

wherein n is from about 1 to about 10 and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

21. A method for vaporizing reactants for deposition of a thin film on a substrate, comprising:

providing an ionic liquid that includes at least one precursor;

transporting the precursor in the vapor phase from the ionic liquid to a substrate;

heating the substrate to a temperature of about 0° C. to about 800° C.; and depositing the precursor on the substrate, wherein the ionic liquid satisfies the formula:

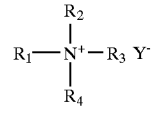

wherein $R_1$, $R_2$, $R_3$, $R_4$ are alkyls and $Y^-$ is selected from a group consisting of halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, and mixtures thereof.

22. A method for vaporizing reactants for vapor deposition of a thin film on a substrate, comprising:

providing an ionic liquid;

dissolving a precursor in the ionic liquid; and passing a stream of gas through the ionic liquid, wherein the ionic liquid satisfies the formula:

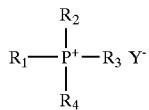

wherein $R_1$, $R_2$, $R_3$, $R_4$, are alkyls and $Y^-$ comprises halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, or mixtures thereof.

23. A method for vaporizing reactants for vapor deposition of a thin film on a substrate, comprising:
  providing an ionic liquid;
  dissolving a precursor in the ionic liquid; and
  passing a stream of gas through the ionic liquid, wherein the ionic liquid satisfies the formula:

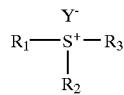

wherein $R_1$, $R_2$, and $R_3$ are alkyls and $Y^-$ comprises halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, or mixtures thereof.

24. A method for vaporizing reactants for vapor deposition of a thin film on a substrate, comprising:
  providing an ionic liquid;
  dissolving a precursor in the ionic liquid; and
  passing a stream of gas through the ionic liquid, wherein the ionic liquid satisfies the formula:

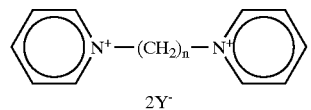

wherein n is from about 1 to about 10 and $Y^-$ comprises halides, sulfates, nitrates, acetates, nitrites, tetrafluoroborates, tetrachloroborates, hexafluorophosphates, $[SbF_6]$, chloroaluminates, bromoaluminates, chlorocuprates, heteropolyanions, trifluoromethanesulfonates, or mixtures thereof.

25. A method for vaporizing reactants for vapor deposition of a thin film on a substrate, comprising:
  providing an ionic liquid;
  dissolving a precursor in the ionic liquid; and
  passing a stream of gas through the ionic liquid, wherein the ionic liquid satisfies the formula:

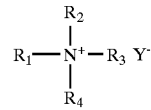

wherein $R_1$, $R_2$, $R_3$, $R_4$ are alkyls and $Y^-$ comprises halides, sulfates, nitrates, acetates, nitrites, tetrafluoroborates, tetrachloroborates, hexafluorophosphates, $[SbF_6]^-$, chloroaluminates, bromoaluminates, chlorocuprates, heteropolyanions, trifluoromethanesulfonates, or mixtures thereof.

* * * * *